United States Patent
Min et al.

(10) Patent No.: US 7,256,471 B2
(45) Date of Patent: Aug. 14, 2007

(54) ANTIFUSE ELEMENT AND ELECTRICALLY REDUNDANT ANTIFUSE ARRAY FOR CONTROLLED RUPTURE LOCATION

(75) Inventors: Won Gi Min, Chandler, AZ (US); Robert W. Baird, Gilbert, AZ (US); Jiang-Kai Zuo, Chandler, AZ (US); Gordon P. Lee, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 27 days.

(21) Appl. No.: 11/095,302

(22) Filed: Mar. 31, 2005

(65) Prior Publication Data

US 2006/0226509 A1    Oct. 12, 2006

(51) Int. Cl.
*H01L 29/00*    (2006.01)

(52) U.S. Cl. .................. 257/530; 257/50; 257/E23.147; 257/410

(58) Field of Classification Search .................. 257/530
See application file for complete search history.

(56) References Cited

U.S. PATENT DOCUMENTS

| | | | |
|---|---|---|---|
| 6,130,469 A * | 10/2000 | Bracchitta et al. | 257/530 |
| 6,396,120 B1 | 5/2002 | Bertin et al. | |
| 6,515,344 B1 * | 2/2003 | Wollesen | 257/530 |
| 6,597,234 B2 | 7/2003 | Beber et al. | |
| 6,753,590 B2 | 6/2004 | Fifield et al. | |
| 6,774,439 B2 | 8/2004 | Fukuzumi et al. | |
| 6,775,197 B2 | 8/2004 | Novosel et al. | |
| 2004/0223363 A1 * | 11/2004 | Peng | 365/154 |
| 2006/0092742 A1 * | 5/2006 | Paillet et al. | 365/225.7 |

* cited by examiner

*Primary Examiner*—Tu-Tu Ho
(74) *Attorney, Agent, or Firm*—Ingrassia Fisher Lorenz (57) ABSTRACT

An antifuse element (102) having end corners (120, 122) of a gate electrode (104) positioned directly above an active area (106) or bottom electrode. The minimum programming voltage between the gate electrode (104) and the active area (106) creates a current path through an insulating layer (110) positioned therebetween. The high electric field created at the end corners (120, 122) of the gate electrode (104) results in a breakdown and rupture of the insulating layer (110) at points directly beneath the end corners (120, 122). This localization of the insulating layer (110) at the corners (120,122) provides for lower post program resistance and variation, and faster programming at a lower programming power. The antifuse elements (102) when integrated into an array (300, 320, 400, 550) provide for increased packing density. The array is fabricated to include multiple active areas (304) for individual antifuse element (302) programming or a common active area (324,405,426,506) for multi-element programming.

18 Claims, 7 Drawing Sheets

ANTIFUSE ELEMENT AND ELECTRICALLY REDUNDANT ANTIFUSE ARRAY FOR CONTROLLED RUPTURE LOCATION

TECHNICAL FIELD OF THE INVENTION

The present invention generally relates to semiconductor integrated circuit technology, and more particularly to antifuse element structures in semiconductor devices.

BACKGROUND OF THE INVENTION

One-time programmable non-volatile memories (OTP) have been widely used in ROMs for circuit trimming and can be realized using a circuit containing fuse or antifuse element structures. When a fuse element is utilized, the device is programmed by blowing fusible links at selected nodes to create an open circuit. The combination of blown and unblown links represents a digital bit pattern of ones and zeros signifying data that a user wishes to store in OTP. A high power is normally required (e.g. ~50 mA for a poly fuse link in a 0.25 um CMOS flow) to blow the link. In addition, a large area with supporting circuits is required. If the resultant opening formed in the circuit is not large enough, the disconnected blown links may become reconnected during long-term operation of the links, resulting in a circuit malfunction and reliability issues.

When an antifuse element is utilized, the programming mechanism is opposite the process of causing an open circuit in the fuse structure to be formed. Instead, the antifuse element programming mechanism creates a short circuit or a low resistance path. The antifuse element includes an insulating dielectric layer, such as a gate oxide, between two conducting layers. The unprogrammed state of an antifuse element is an open circuit with intact dielectric. The programmed state is a shorting path at a damaged point, known as the rupture point, in the dielectric/gate oxide formed by applying a voltage higher than the dielectric rupture voltage. It is known that, as the gate oxide in CMOS flows becomes thinner (below 50 Å), many NMOS or PMOS types of structures are useful as antifuses, because the gate oxide rupture voltage/current becomes lower with thinner oxides resulting in a smaller trim circuit. Furthermore, spontaneous healing of a ruptured gate oxide is very unlikely, resulting in improved device reliability.

Typically, previous approaches to the inclusion of antifuse elements using CMOS type devices tie the source, drain, and body together as the bottom electrode, and the polysilicon gate as the top electrode. During programming, the rupture points can occur on the source side, drain side, or any point in a channel region formed under the polysilicon gate. This results in a relatively large resistance variation. In addition, when the rupture is located in the channel region under the gate, undesirable diode behavior may be measured between the polysilicon gate and silicon body, due to the opposite doping types. In general, previous antifuse elements are characterized by: (1) a program voltage higher than a low voltage CMOS transistor operation voltage; (2) long programming time (the charge-to-breakdown (QBD) is a function of gate oxide thickness, area and defects); and (3) large post program resistance and variation due to random rupture locations in the gate oxide.

Accordingly, it would be desirable to provide an antifuse element, a method of forming an antifuse element, and the integration of a plurality of antifuse element structures into an electrically redundant antifuse array (ERAA), in which the rupture location is controlled and the local rupture electric fields are enhanced. Other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, or the following detailed description.

In accordance with the present invention, there is provided an antifuse element utilizing a unique gate capacitor, method of forming the antifuse element, and the integration of a plurality of antifuse elements within an array.

Figure 1:
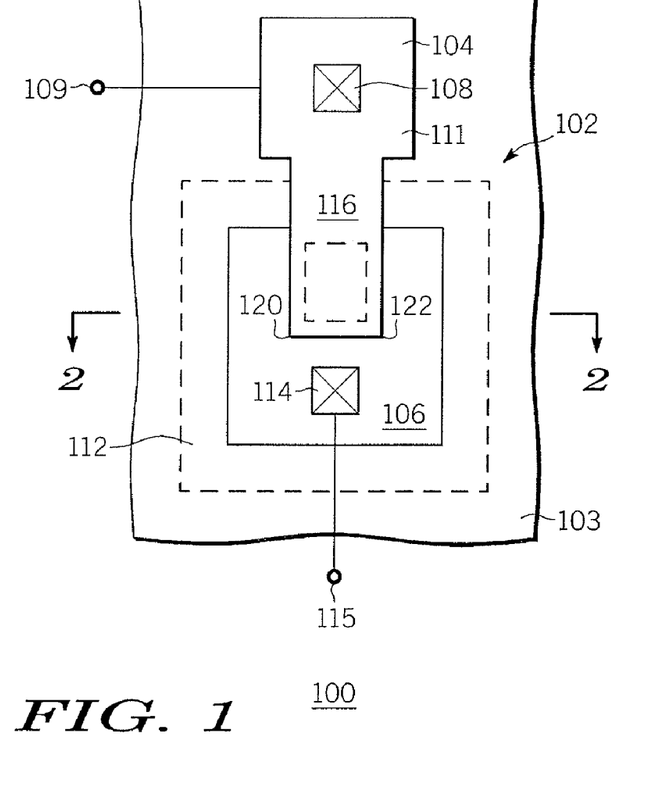
FIG. 1 is a top schematic diagram of an antifuse element in accordance with an embodiment of the present invention.
Figure 2:
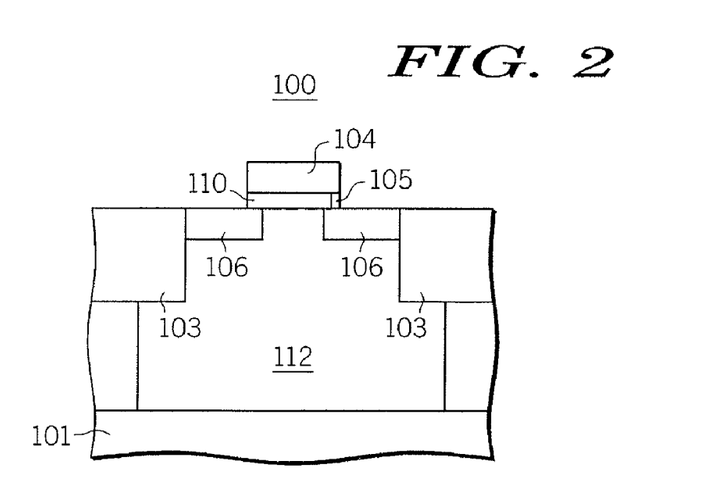
FIG. 2 is a cross-sectional schematic diagram of the antifuse element shown in FIG. 1 taken along line 2-2, in accordance with an embodiment of the present invention.

Turning now to the drawings, FIGS. 1-2 are top and cross sectional views of an embodiment of an antifuse element according to the present invention. A semiconductor device 100, more particularly an antifuse element 102, is formed as a unique gate capacitor comprising a gate material and an active area formed in a substrate material 101, bounded by shallow trench isolation (STI) 103. Substrate material 101 may be a standard semiconductor substrate such as bulk or epitaxial silicon wafer. Antifuse element 102 is comprised of a top gate electrode 104 and an active area 106, which serves as a bottom electrode. The surface of active area 106 may include heavy n-type or p-type implants to provide for good electrical contact.

Gate electrode 104 may be formed of polysilicon and serves as a top electrode for antifuse element 102. Gate electrode 104 has a minimum width, usually submicron, which extends to overlay at least a portion of active area 106. In this preferred embodiment, gate electrode 104 is formed of an n-doped polysilicon material as is well known in the art and includes a contact 108 formed on an uppermost surface 111 thereof. Gate electrode 104 is positioned to extend over active area 106, which serves as the bottom electrode. In this embodiment, gate electrode 104 is formed having a first end corner 120 and a second end corner 122 that overlay a portion of active area 106, thereby falling "within" active area 106. An insulative material 110, as shown in FIG. 2, is formed there between gate electrode 104 and active area 106. In a preferred embodiment, insulative material 110 is a dielectric material, such as any material suitable for a gate oxide. Gate electrode 104 extends over insulative material 110 and a portion of active area 106.

As shown in FIG. 2, antifuse element 102 includes a highly doped nwell 112 formed in a surface of substrate material 101, to have the same doping type as n-doped gate electrode 104. In the alternative, antifuse element 102 may include a highly doped pwell 112, when gate electrode 104 is p-doped. An nwell is preferred due to a resultant lower resistance path that is formed subsequent to rupturing of insulative material 110. A FSDF Device 100 is a CMOS capacitor that functions as an antifuse by becoming conductive after undergoing programming. Prior to any programming event, wherein a voltage is applied between contacts 108 and 114, via terminal 115 and a terminal 109, the path between gate contact 108 and diffusion or well contact 114 is an open circuit. Generally, the programming voltage is the voltage above the rupture voltage that will cause antifuse element 102 to change from an open state to a closed state, by causing a rupture (i.e. a breakdown of insulative material 110 between gate electrode 104 and active area 106). During programming of antifuse element 102, a programming voltage is applied between gate electrode 104 and the active area, or bottom electrode, 106. The programming event creates a vertical current path between gate electrode 104 and active area 106, the bottom electrode. A rupture 105, or breakdown, of insulating layer 110, formed therebetween, will occur at a point where the electric field is the highest. During programming, the highest electric fields will occur at end corners 120 and 122 of gate electrode 104 that overlay active region 106. More specifically, the highest electric fields will occur at end corners 120 and 122 of gate electrode 104 where the conducting path to nwell contact 114 is the shortest. Accordingly, rupture 105, or a breakdown, of insulating layer 110 occurring at end corners 120 and 122 of gate electrode 104 is controlled and leads to low resistance between gate electrode 104 and active area 106. diffusion contact or well contact 114, in conjunction with a terminal 115, serves as a contact to nwell 112 and is formed proximate an end 116 (FIG. 1) of overlying gate electrode 104. It is a design goal to provide for minimum spacing between end 116 of overlying gate electrode 104 and diffusion or well contact 114 to allow for a lower programming voltage.

FSDF Device 100 is a CMOS capacitor that functions as an antifuse by becoming conductive after undergoing programming. Prior to any programming event, wherein a voltage is applied between contacts 108 and 114, via terminal 115 and a terminal 109, the path between gate contact 108 and diffusion or well contact 114 is an open circuit. Generally, the programming voltage is the voltage above the rupture voltage that will cause antifuse element 102 to change from an open state to a closed state, by causing a rupture (i.e. a breakdown of insulative material 110 between gate electrode 104 and active area 106). During programming of antifuse element 102, a programming voltage is applied between gate electrode 104 and the active area, or bottom electrode, 106. The programming event creates a vertical current path between gate electrode 104 and active area 106, the bottom electrode. A rupture 105, or breakdown, of insulating layer 110, formed therebetween, will occur at a point where the electric field is the highest. During programming, the highest electric fields will occur at end corners 120 and 122 of gate electrode 104 that overlay active region 106. More specifically, the highest electric fields will occur at end corners 120 and 122 of gate electrode 104 where the conducting path to nwell contact 114 is the shortest. Accordingly, rupture 105, or a breakdown, of insulating layer 110 occurring at end corners 120 and 122 of gate electrode 104 is controlled and leads to low resistance between gate electrode 104 and active area 106.

As best illustrated in FIG. 1, this embodiment of antifuse element 102 requires the positioning of gate electrode 104 so that the plurality of end corners 120 and 122 overlie active area 106 and are considered to be "within" active area 106. This unique arrangement has two significant advantages. The first advantage is that the rupture occurs in at end corners 120 and 122 of the gate electrode 104 having the closest conducting path to nwell contact 114. This results in not only a low shorting-path resistance but also a tight distribution of the post program resistance. The second advantage is that a plurality of gate electrodes similar to gate electrode 104 can be densely packed in parallel in a common active area (described in detail below). This increased packing density will result in an electrically redundant antifuse array (ERAA) with simplified supporting circuits.

Figure 3:
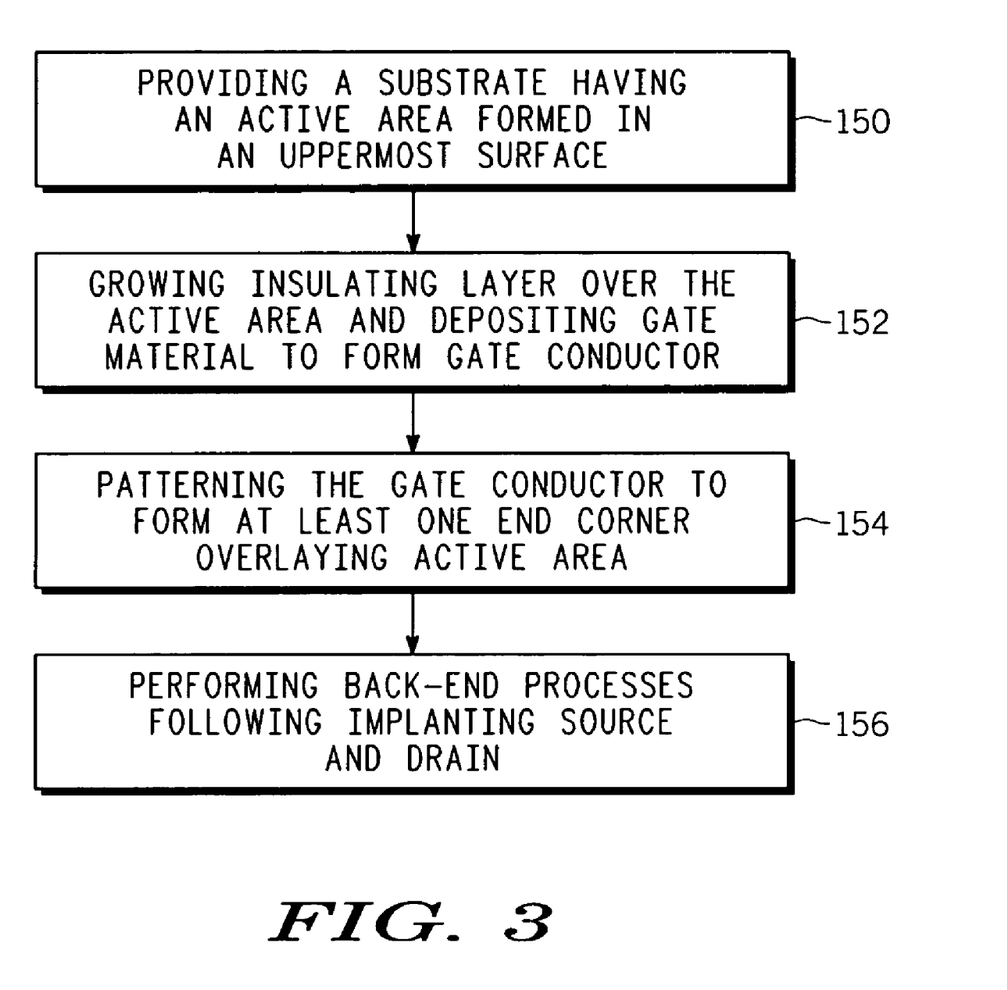
FIG. 3 a simplified diagram illustrating a method of fabricating an antifuse element according to the present invention.

FIG. 3 illustrates in a simplified diagram, a method of fabricating an antifuse element according to the present invention utilizing standard CMOS fabrication techniques well known in the art. MOS device 100 of FIGS. 1 and 2 is made to function as an antifuse without performing any additional processing steps beyond those normally undertaken in its manufacture, thus no additional cost. During fabrication of device 100 of FIGS. 1 and 2, a trench process and implant technique are performed on a substrate, such as a silicon wafer, to define active area 106 and nwell 112 as is shown at 150. Subsequent growth of a gate oxide on active area 106 and gate material deposition (i.e. polysilicon) are performed to form a MOS structure and gate electrode 104 having an insulating gate oxide material 110 formed therebetween as is shown at 152. Gate electrode 104 is patterned to form at least one end corner overlaying the active area as is shown at 154. Gate electrode 104 is fabricated so that end corners 120 and 122 overlay active area 106. As previously described in connection with FIGS. 1 and 2, gate electrode 104 is defined by a plurality of end corners fabricated to overlay active area 106, thereby providing for rupture points at the plurality of end corners. An nwell contact is fabricated as near as possible to the overlying end corners to minimize a post program conducting path. Source and drain implant, interdielectric layer deposition, contact etch, and additional back-end processes are performed as is shown at 156 to complete antifuse element 102.

Figure 4:
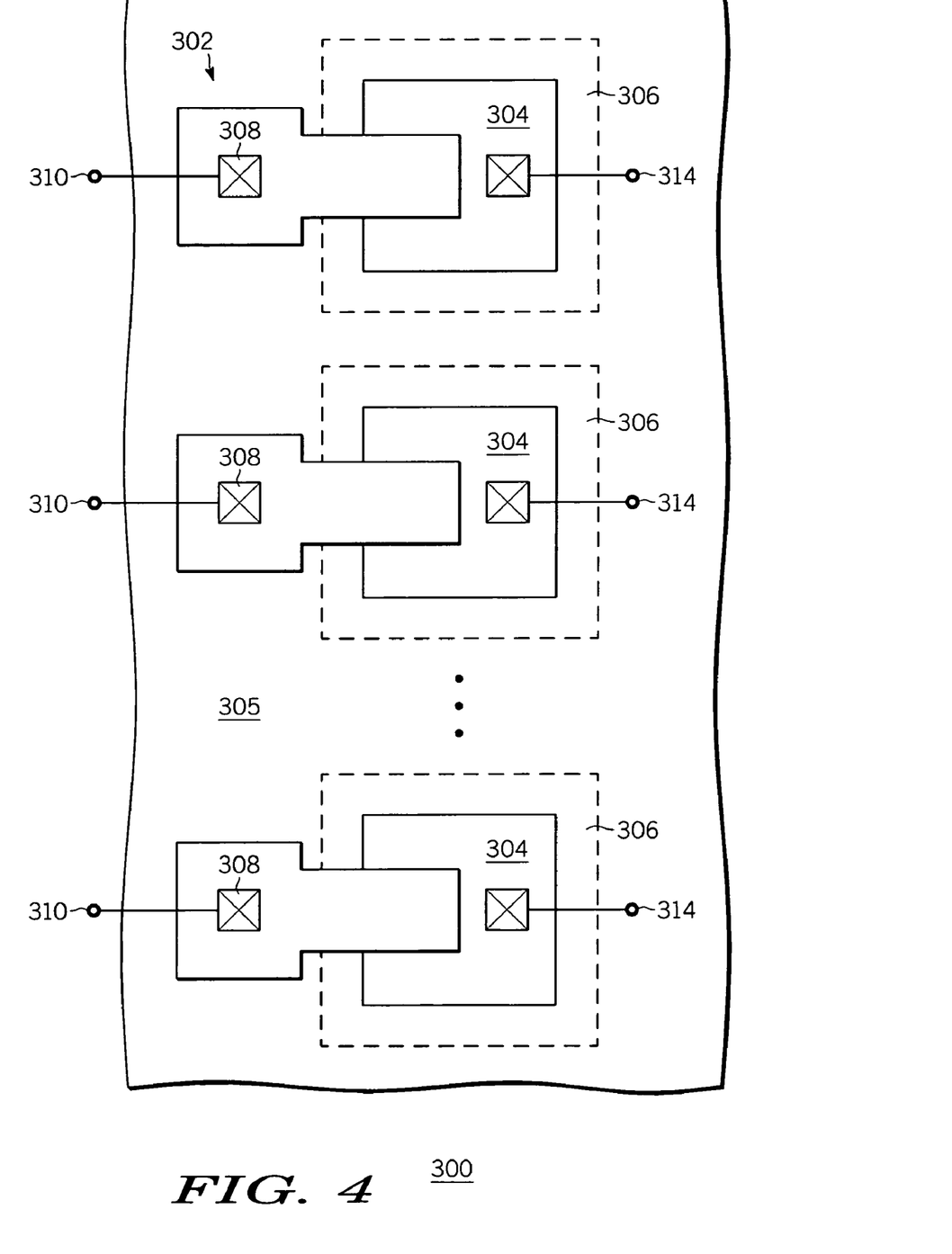
FIG. 4-7 are top schematic diagrams of antifuse arrays in accordance with further embodiments of the present invention.

FIGS. 4-7 illustrate alternative array layouts formed by integrating a plurality of the antifuse elements of the present invention. To achieve higher packing densities, a plurality of antifuse elements formed according to the previously described embodiments are utilized. More specifically, FIG. 4, illustrates an electrically redundant antifuse array (ERAA) 300 formed according to the present invention. Array 300 comprises a plurality of antifuse elements 302 formed on a substrate 305 similar to antifuse element 102 of FIGS. 1-2. Antifuse elements 302 are formed atop separate nwells 306 and include separate active areas 304 for each antifuse element 302. This type of array layout provides for electrical isolation between the plurality of antifuse elements 302 that comprise array 300. Individual programming of each antifuse element is achieved through conductor terminals 310 and diffusion or well terminals 314. The electrical isolation that provides for individual programming of antifuse elements 302, increases flexibility and the packing density of array 300.

Figure 5:
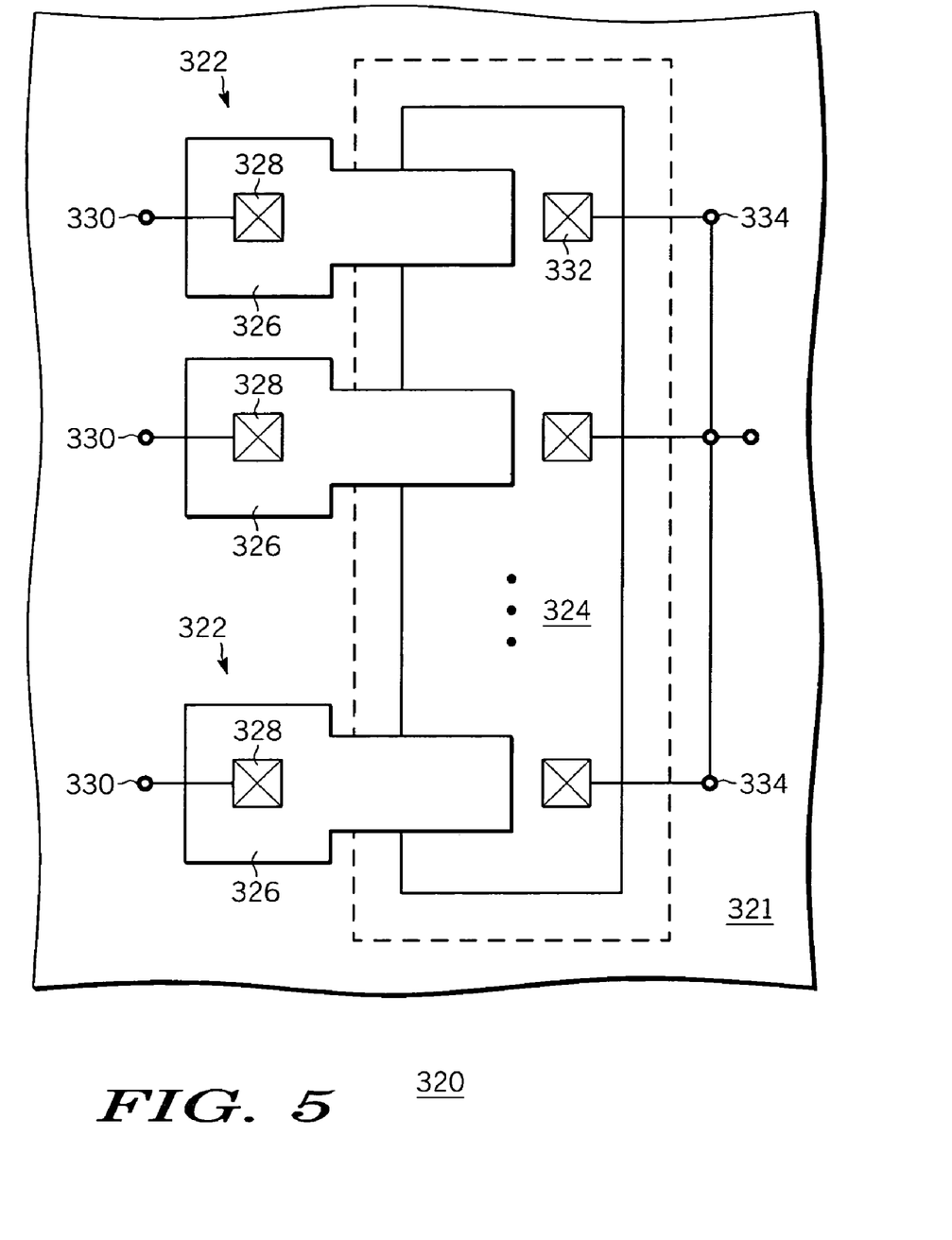

FIG. 5 illustrates an alternative embodiment of an array layout according to the present invention. In this particular array layout 320 formed on a substrate 321, a plurality of antifuse elements 322 are formed that share a common active area 324, and thus a common terminal 334. Antifuse elements 322 and more specifically, a plurality of gate electrodes 326 are programmable through a plurality of contacts 328 via a plurality of gate terminals 330 and a plurality of diffusion or well contacts 332 via a plurality of terminals 334. This type of layout provides for further increased packing density.

Figure 6:
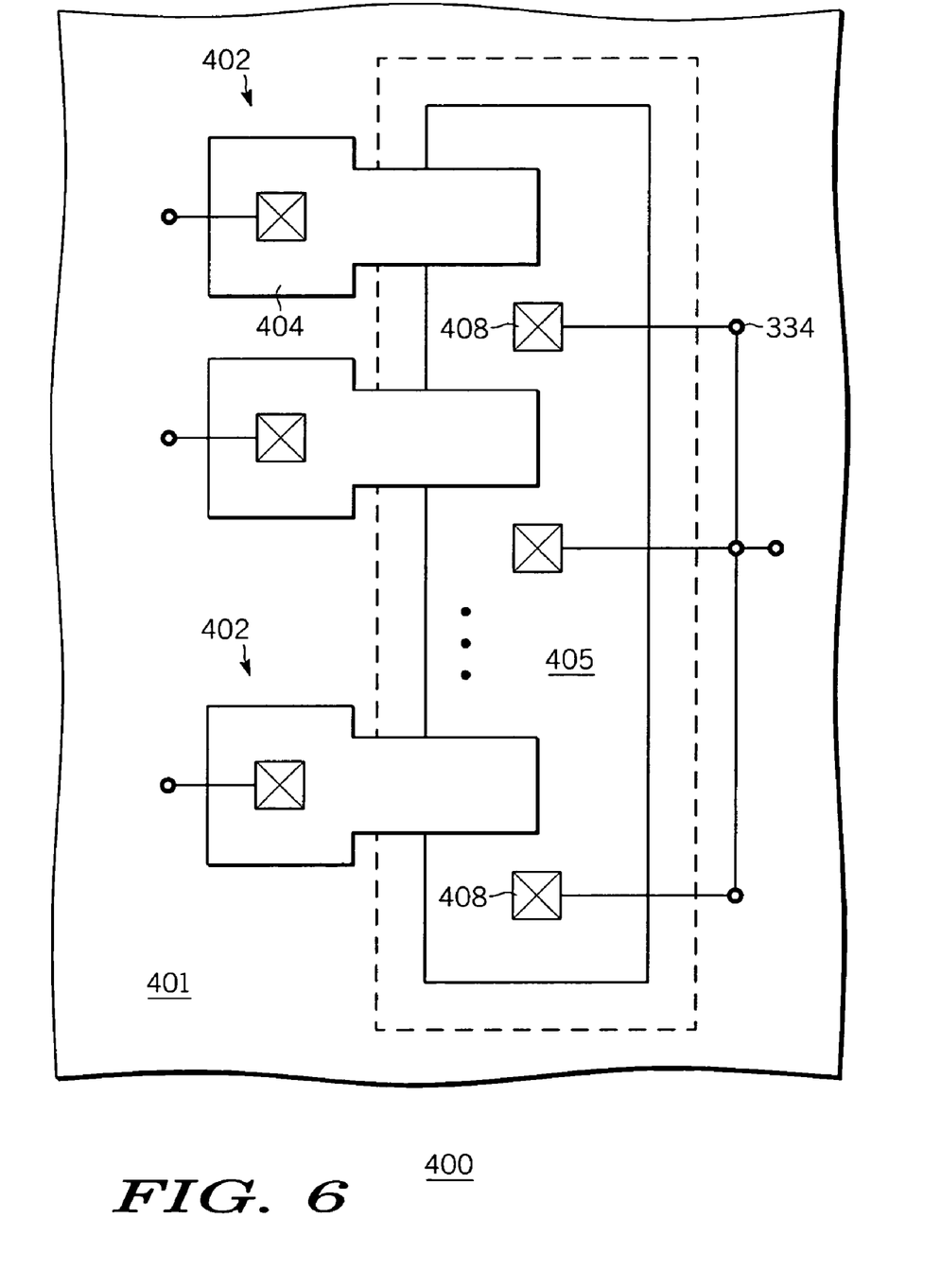

FIG. 6 is a top schematic view of yet another embodiment of an electrically redundant antifuse array 400 formed on a substrate 401 according to the present invention including a plurality of antifuse elements 402, each defined by a gate electrode 404 and a common active area 405. A plurality of diffusion or well contacts 408 are formed on an uppermost surface of common active areas 405. In this particular array layout, each individual antifuse element 402, and more particularly a plurality of end corners 406 of each gate electrode 404 where the highest electric fields are created, is associated with multiple diffusion or well contacts 408 resulting in lower device resistance after programming is complete. This configuration provides for increased packing density.

Figure 7:
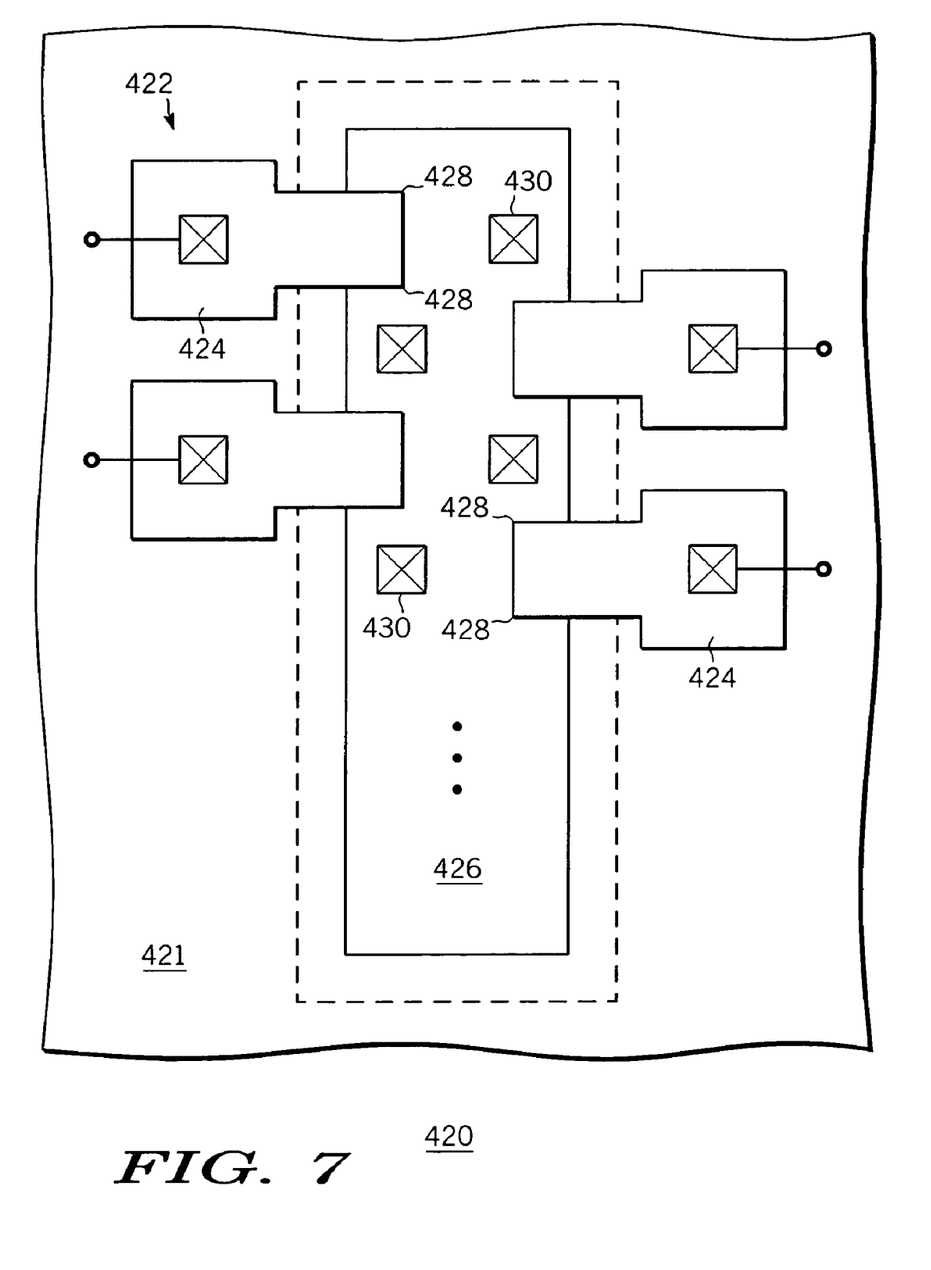

FIG. 7 illustrates a further embodiment of an electrically redundant antifuse array 420 formed on a substrate 421. Array 420 is comprised of a plurality of antifuse elements 422 as previously described in conjunction with FIGS. 1-2. Antifuse elements 422 are defined by a plurality of gate electrodes 424 that are positioned in an interleaving configuration about a common active area 426. In this type of array layout, a plurality of end corners 428 of each individual gate electrode 424 are in close electrical contact with a plurality of diffusion or well contacts 430. In FIG. 7, each individual gate electrode is in close electrical contact with at least three diffusion or well contacts resulting in low post program resistance and increased packing density.

Figure 8:
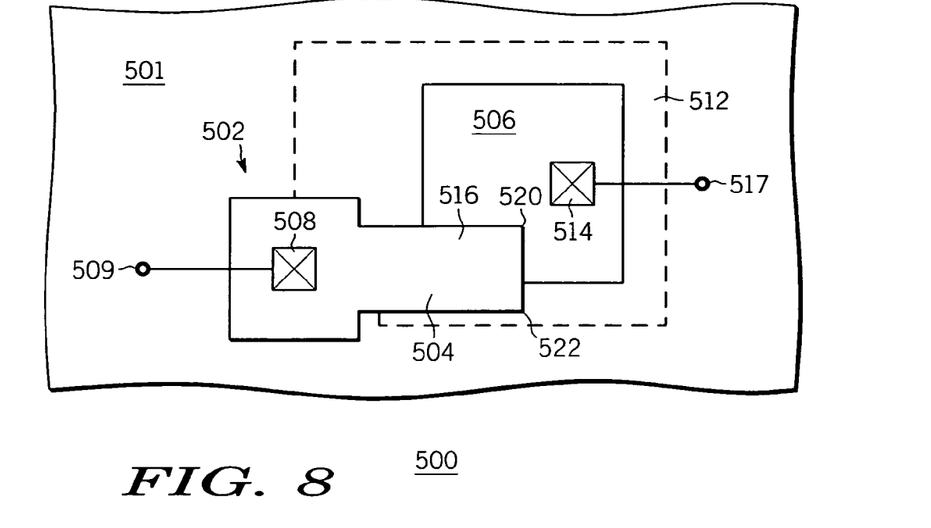
FIG. 8 is a top schematic diagram of an antifuse element in accordance with a further embodiment of the present invention.
Figure 9:
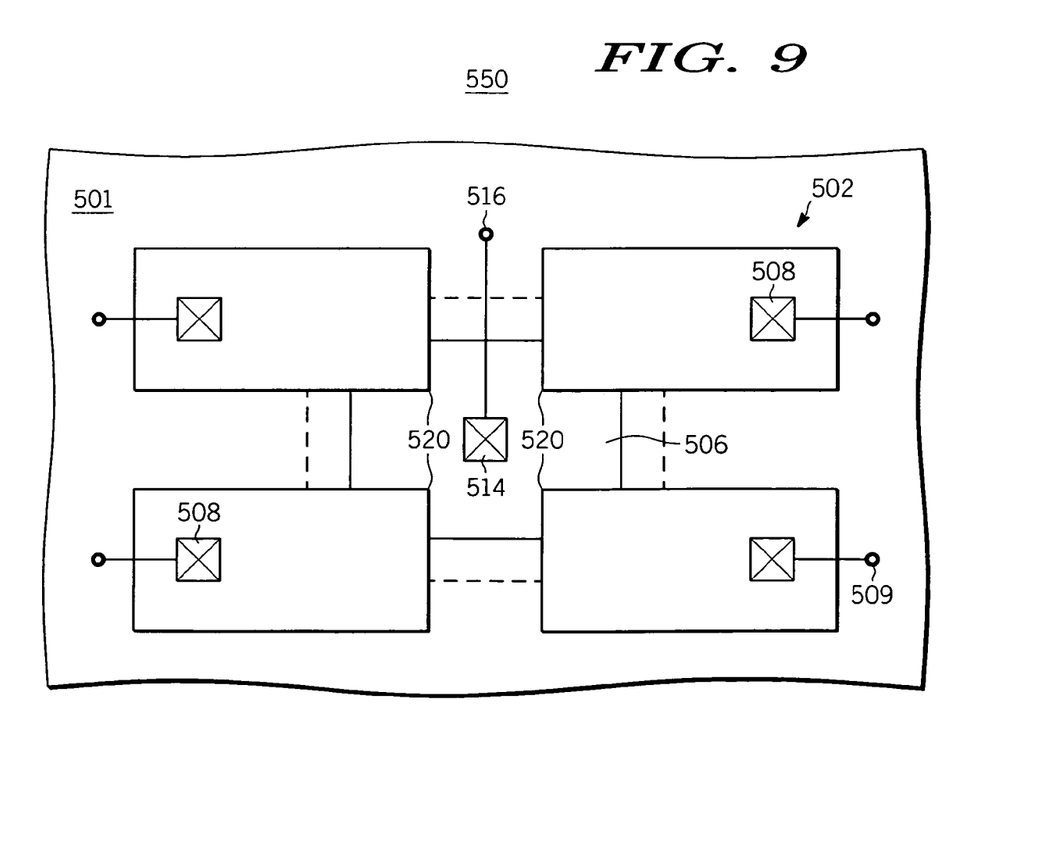
FIG. 9 is a top schematic diagram of an antifuse array in accordance with a further embodiment of the present invention.

FIGS. 8-9 are top schematic views of yet another embodiment of the present invention illustrating a semiconductor device 500, and more particularly an antifuse element 502 formed on a substrate 501 as a unique gate capacitor comprising a gate material and a second conductor comprising an active area bounded by shallow trench isolation. More specifically, antifuse element 502 comprises a gate electrode 504 and an active area 506, which also serves as an electrode. Gate electrode 504 is formed of n-doped polysilicon and serves as a top electrode for antifuse element 502. Gate electrode 504 has a minimum width in a given technology, generally submicron, which extends to overlay at least a portion of active area 506. In this embodiment, gate electrode 504 is formed of a polysilicon material as is well known in the art and includes a contact 508 positioned on an uppermost surface thereof and terminal 509, a first end corner 520 and second end corner 522. Gate electrode 504 is positioned to extend over active area 506, which serves as the bottom electrode. An insulative material (not shown), is formed therebetween gate electrode 504 and active area 506. Gate electrode 504 extends over the insulative material and a portion of active area 506.

Active area 506 includes a highly doped nwell 512, to have the same doping type as gate electrode 504. It is anticipated that in the alternative, active area 506 will include a highly doped pwell, when the gate electrode is p-doped. A diffusion or well contact 514 serves as a contact to nwell 512 and is formed proximate an end 516 of overlying gate electrode 504. It is a design goal to provide for minimum spacing between end 516 of overlying gate electrode 504 and diffusion or well contact 514 to allow for a lower post program resistance and variation.

Programming of antifuse element 502 involves applying a programming voltage between gate electrode 504 and active area, or bottom electrode, 506 through a gate terminal 509 and a terminal 517. In this embodiment, gate electrode 504 is formed having only first end corner 520 overlying active area 506, or falling "within" active area 506. Second end corner 522 lies outside active area 506. During programming of antifuse element 502, a vertical current path is created between gate electrode 504 and active area 506, the bottom electrode. The highest electric field will inherently occur at first end corner 520 of gate electrode 504 that overlays active region 506 due to its being located where the conducting path is shortest to an nwell contact 514. Controlled rupture of antifuse element 502 at end corner 520 leads to lower resistance between gate electrode 504 and active area 506.

In contrast to antifuse element 102 of FIGS. 1 and 2, antifuse element 502 requires only the positioning of a single end corner, first end corner 520, to overlie active area 506, and thus fall "within" active area 106. This arrangement provides an array 550 formed on a substrate 501, having a layout as illustrated in FIG. 9 in which a plurality of antifuse elements 502 are formed and share a single active area 506. By fabricating only a single end corner 520 of each gate electrode 504 to overlay active area 506, array 550 is densely packed in parallel in the common active area 506, which will result in an electrically redundant antifuse array (ERAA) with simplified supporting circuits.

Typical fuses or antifuses are one time programmable. Once the fuses are programmed, it is impossible to reverse the states (open or short). Thus, typical fuse and antifuse programming is a permanent event. When the fuse or antifuse elements are fabricated into an array with redundancy, such as disclosed herein, the spare antifuses can be utilized to re-program the IC device, thereby forming an electrically redundant antifuse array (ERAA).

Accordingly, an antifuse element is provided and comprises: a substrate material having an active area formed in an uppermost surface; a gate electrode having an end corner positioned above the active area; and an insulating layer disposed between the gate electrode and the active area such that a voltage between the gate electrode and the active area creates a current path through the insulating layer and an electric field at the end corner of the gate electrode positioned above the active area, causing a rupture of the insulating layer at a point beneath the end corner of the gate electrode. The antifuse element can further include the gate electrode having a first end corner and a second end corner positioned above the active area, such that the voltage between the gate electrode and the active area creates an electric field at the first end corner and the second end corner of the gate electrode, causing a rupture of the insulating layer at a point beneath each of the first and second end corners of the gate electrode. The substrate material is typically a semiconductor material. The active area comprises an electrically conductive doped region and the insulating layer comprises a gate oxide.

In addition, a method of an antifuse element is disclosed comprising: providing a substrate material having an active area formed in an uppermost surface; forming a gate electrode having an end corner positioned above the active area;

and forming an insulating layer disposed between the gate electrode and the active area such that a voltage between the gate electrode and the active area creates a current path through the insulating layer and an electric field at the end corner positioned above the active area, causing a rupture of the insulating layer at a point beneath the end corner. The step of forming a gate electrode can further include forming a gate electrode having a first end corner and a second end corner positioned above the active area, such that the voltage between the gate electrode and the active area creates an electric field at the first end corner and the second end corner, causing a rupture of the insulating layer at a point beneath each of the first and second end corners.

Additionally, disclosed is an electrically redundant antifuse array comprising a plurality of antifuse elements formed on a substrate. Each antifuse element of the array comprising: an active area formed in an uppermost surface of the substrate; a gate electrode having an end corner positioned above the active area; and an insulating layer disposed between the gate electrode and the active area such that a voltage between the gate electrode and the active area creates a current path through the insulating layer and an electric field at the end corner positioned above the active area, causing a rupture of the insulating layer at a point beneath the end corner of the gate electrode. Various array embodiments of an array are disclosed, including: an array wherein the active area of each of the plurality of antifuse elements is individually programmable; an array wherein the plurality of antifuse elements are formed having a common active area and are commonly programmable; an array wherein each of the plurality of antifuse elements has a first end corner and a second end corner that overlies the common active area; an array wherein the first end corner and the second end corner of each of the plurality of gate electrodes are in electrical communication with a plurality of well contacts; an array wherein the plurality of antifuse elements are formed on opposing sides of an uppermost surface of the substrate, having end corners of the plurality of gate electrodes interleaved; and an array wherein the first end corner and the second end corner of each of the plurality of gate electrodes are in electrical communication with a single well contact.

While a plurality of exemplary embodiments have been presented in the foregoing detailed description, it should be appreciated that additional variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. It should be understood that various changes can be made in the function and arrangement of elements without departing from the scope of the invention as set forth in the appended claims and the legal equivalents thereof.

What is claimed is:

1. An antifuse element comprising:
   a substrate material having an active area formed in an uppermost surface;
   a gate electrode having an outer perimeter end corner positioned above the active area; and
   an insulating layer disposed between the gate electrode and the active area such that a voltage between the gate electrode and the active area creates a current path through the insulating layer and an electric field at the outer perimeter end corner of the gate electrode positioned above the active area, causing a rupture of the insulating layer at a point beneath the outer perimeter end corner of the gate electrode.

2. An antifuse element as claimed in claim 1, wherein the gate electrode includes a first outer perimeter end corner and a second outer perimeter end corner positioned above the active area, such that the voltage between the gate electrode and the active area creates an electric field at the first outer perimeter end corner and the second outer perimeter end corner of the gate electrode, causing a rupture of the insulating layer at a point beneath each of the first and second outer perimeter end corners of the gate electrode.

3. An antifuse element as claimed in claim 1, wherein the substrate material is a semiconductor material.

4. An antifuse element as claimed in claim 1, wherein the active area comprises an electrically conductive doped region.

5. An antifuse element as claimed in claim 1, wherein the insulating layer is a gate oxide.

6. An antifuse element as claimed in claim 1, wherein the current path is oriented essentially perpendicular to both the gate electrode and the active area.

7. A method of forming an antifuse element, the method comprising:
   providing a substrate material having an active area formed in an uppermost surface;
   forming a gate electrode having an outer perimeter end corner positioned above the active area; and
   forming an insulating layer disposed between the gate electrode and the active area such that a voltage between the gate electrode and the active area creates a current path through the insulating layer and an electric field at the outer perimeter end corner positioned above the active area, causing a rupture of the insulating layer at a point beneath the outer perimeter end corner of the gate electrode.

8. A method of forming an antifuse element as claimed in claim 7 wherein the step of depositing a gate material to form a gate electrode includes depositing a gate material to form a gate electrode having a first outer perimeter end corner and a second outer perimeter end corner positioned above the active area, such that the voltage between the gate electrode and the active area creates an electric field at the first outer perimeter end corner and the second outer perimeter end corner, causing a rupture of the insulating layer at a point beneath each of the first and second outer perimeter end corners.

9. A method of forming an antifuse element as claimed in claim 7 further including the step of providing a programming voltage to the antifuse element and causing the rupture of the insulating layer at a point beneath the outer perimeter end corner of the gate electrode.

10. A method of forming an antifuse element as claimed in claim 9 wherein the step of providing a programming voltage to the antifuse element includes the step of causing the rupture of the insulating layer at a point beneath a first outer perimeter end corner and a second outer perimeter end corner of the gate electrode.

11. An electrically redundant antifuse array comprising:
    a plurality of antifuse elements formed on a substrate, each antifuse element comprising:
       an active area formed in an uppermost surface of the substrate;
       a gate electrode having an outer perimeter end corner positioned above the active area; and
       an insulating layer disposed between the gate electrode and the active area such that a voltage between the gate electrode and the active area creates a current path through the insulating layer and an electric field at the outer perimeter end corner positioned above the active area, causing a rupture of the insulating layer at a point beneath the outer perimeter end corner of the gate electrode.

12. An electrically redundant antifuse array as claimed in claim 11 wherein the active area of each of the plurality of antifuse elements is individually programmable.

13. An electrically redundant antifuse array as claimed in claim 11 wherein the plurality of antifuse elements are formed having a common active area and are commonly programmable.

14. An electrically redundant antifuse array as claimed in claim 13 wherein each of the plurality of antifuse elements has a first outer perimeter end corner and a second outer perimeter end corner that overlies the common active area.

15. An electrically redundant antifuse array as claimed in claim 14 wherein the first outer perimeter end corner and the second outer perimeter end corner of each of the plurality of gate electrodes are in electrical communication with a plurality of well contacts.

16. An electrically redundant antifuse array as claimed in claim 15 wherein the plurality of antifuse elements are formed on opposing sides of an uppermost surface of the substrate, having outer perimeter end corners of the plurality of gate electrodes interleaved.

17. An electrically redundant antifuse array as claimed in claim 11 wherein the first end outer perimeter corner and the second outer perimeter end corner of each of the plurality of gate electrodes are in electrical communication with a single well contact.

18. An electrically redundant antifuse array comprising:
a plurality of antifuse elements formed on a substrate, each antifuse element comprising:
an active area formed in an uppermost surface of the substrate;
a gate electrode having an end corner positioned above the active area; and
an insulating layer disposed between the gate electrode and the active area such that a voltage between the gate electrode and the active area creates a current path through the insulating layer and an electric field at the end corner positioned above the active area, causing a rupture of the insulating layer at a point beneath the end corner of the gate electrode,
wherein the plurality of antifuse elements are formed on opposing sides of an uppermost surface of the substrate, and including end corners of the plurality of gate electrodes interleaved.

* * * * *